United States Patent [19]

Yamashita

[11] 4,127,866
[45] Nov. 28, 1978

[54] REFERENCE SIGNAL GENERATOR
[75] Inventor: Noriyuki Yamashita, Ichikawa, Japan
[73] Assignee: Sony Corporation, Tokyo, Japan
[21] Appl. No.: 811,770
[22] Filed: Jun. 30, 1977
[30] Foreign Application Priority Data
Jul. 5, 1976 [JP] Japan .................................. 51-79706
[51] Int. Cl.² ............................................. H04N 9/46
[52] U.S. Cl. ........................................... 358/19; 358/8
[58] Field of Search ...................... 358/19, 8; 178/69.1
[56] References Cited
U.S. PATENT DOCUMENTS
3,860,952   1/1975   Tallent et al. ............................. 358/8
4,015,288   3/1977   Ebihara et al. ........................... 358/8

Primary Examiner—Richard Murray
Attorney, Agent, or Firm—Lewis H. Eslinger; Alvin Sinderbrand

[57] ABSTRACT

A reference signal generator used to compensate for a time base error of a color video signal reproduced from a VTR (video tape recorder) having an oscillator for generating a train of pulses that are synchronized in phase with an input pulse, i.e., color burst signal, a first counter for counting the train of pulses from the above oscillator, a second counter for counting a continuous wave signal that is stabilized in frequency through an AFC (automatic frequency control) circuit, and an error detector or comparator adapted to detect the difference between the time points when the first and second counters count the predetermined numbers respectively and control the oscillation frequency of the above oscillator in response to the time difference, whereby the oscillator as mentioned above is capable of generating the chain of pulses having the phase synchronized with the input pulse and the repetition frequency coinciding with the frequency of the continuous wave signal.

9 Claims, 34 Drawing Figures

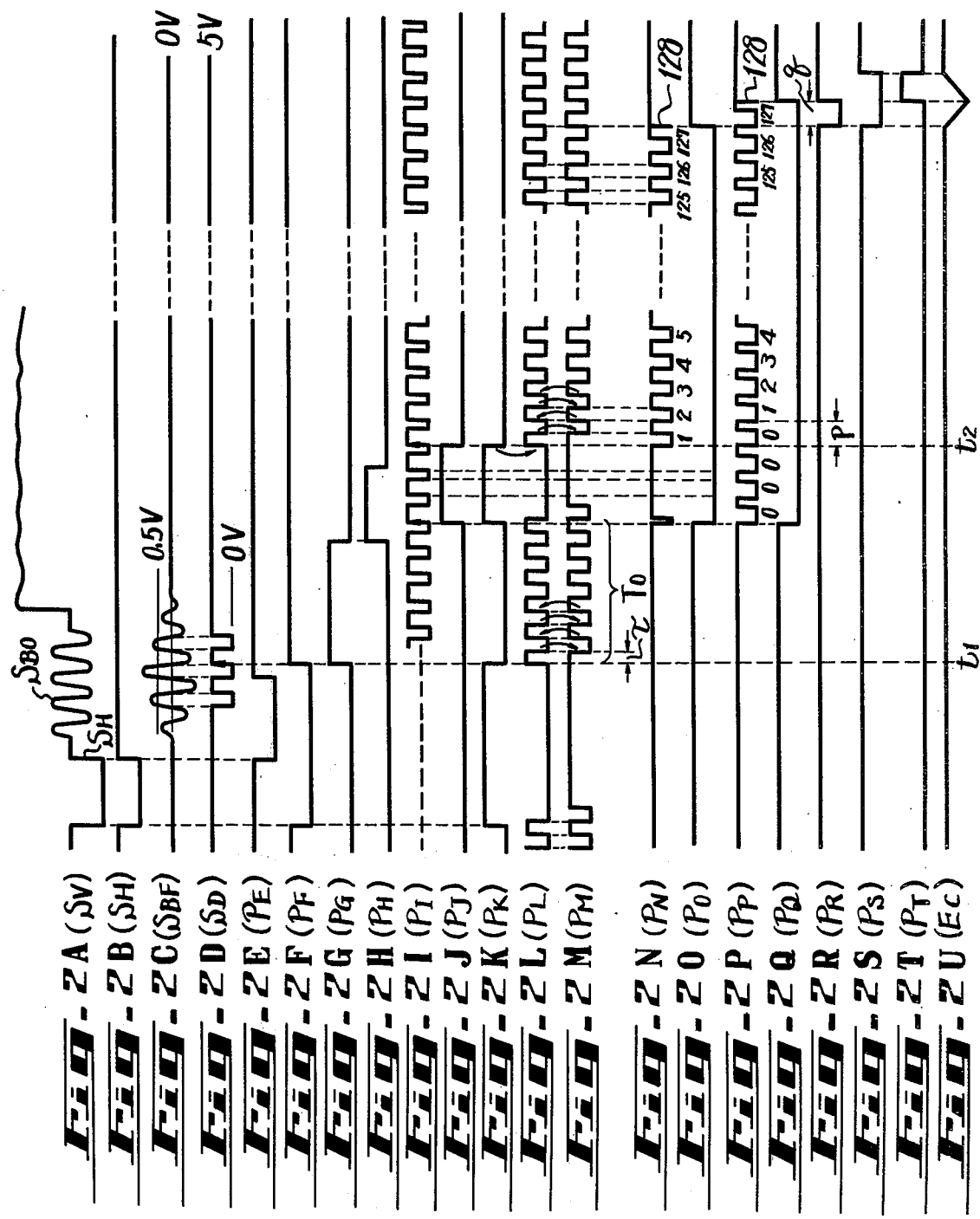

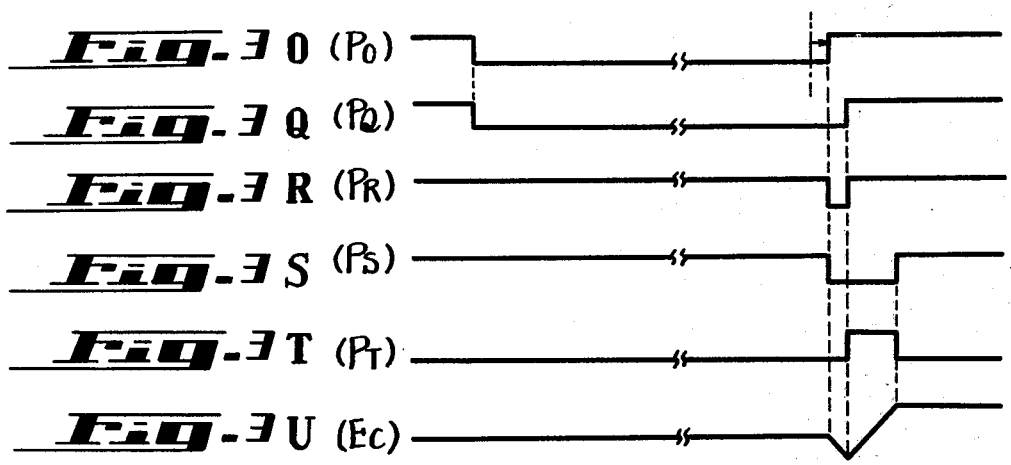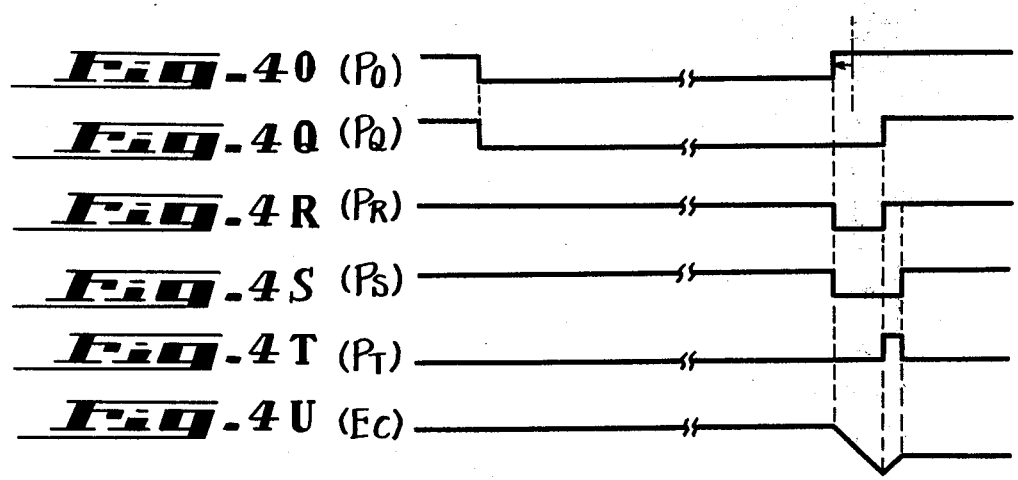

REFERENCE SIGNAL GENERATOR

BACKGROUND OF THE INVENTION

1. Field of the Invention

The present invention relates generally to a reference signal generator for use with a time base corrector (TBC) for correcting a time base error of a color video signal reproduced from a VTR, and more particularly is directed to the reference signal generator oscillating in synchronism with the burst signal of the reproduced color video signal.

2. Description of the Prior Art

In general, a reproduced color video signal obtained from a video tape recorder has a time base error. As a method for correcting the time base error, it has been proposed that the reproduced color video signal is converted into a digital signal by using a TBC (time base error corrector), then memorized in a memory element the memorized digital signal being read out and reconverted into an analogue signal. In this case, the conversion of the video signal into a digital signal and the writing it into a memory are performed by a clock pulse with its repitition frequency corresponding to that of the reproduced horizontal synchronizing signal and its phase synchronized with the reproduced burst signal, and the read-out from the memory and the reconversion to an analogue signal are carried out by a clock pulse of a constant frequency.

In order to generate the clock pulse synchronized in phase with the reproduced burst signal, it is necessary to use a phase synchronizing circuit, namely the so-called APC (automatic phase control) circuit, which requires at least several cycles of a reference signal for the phase comparison. The burst signal has more than eight cycles but is with accurate phase only in one or two cycles of the mid portion and is not necessarily accurate in the cycles of its front and back sides. Therefore, when the burst signal of eight cycles or more is directly applied to the APC as a reference signal for the phase comparison, the clock pulse with its phase maintained accurate can not be derived therefrom.

SUMMARY OF THE INVENTION

Therefore, it is an object of the invention to provide a reference signal generator with its oscillation frequency controlled in accordance with the frequency of the reproduced horizontal synchronizing signal and its oscillation phase synchronized with the one-cycle that is detected from the correct-phase mid-portion of the reproduced burst signal.

Another object of the invention is to obtain necessary correct-phase cycles of the burst signal irrespective of the frequency change of the burst signal.

Still another object of the invention is to provide a reference signal generator capable of operating with stability even though the circuit elements thereof are varied with temperature.

To these ends, it will be considered that a reference signal for the phase-comparison in the APC be produced from an oscillator. That is, the reproducing tracking locus in the helical scan-type VTR differs depending on the reproducing modes such as the so-called normal reproducing mode, slow or still motion reproducing mode, or quick motion reproducing mode under which the reproduced color video signal is obtained, so that if the frequency of the reproduced horizontal synchronizing signal changes, the reproduced burst signal also varies in frequency. Thus, if the oscillator is arranged so that the oscillation frequency is controlled in accordance with the frequency of the reproduced horizontal synchronizing signal and the oscillation phase of the oscillator is synchronized with one cycle that is detected from the correct-phase mid-portion of the reproduced burst signal, the oscillator can generate an oscillation signal the phase of which represents at each cycle the correct phase of the burst signal.

The other objects, features and advantages of this invention will become apparent from the following detailed description taken in conjunction with the accompanying drawings.

BRIEF DESCRIPTION OF THE DRAWINGS

FIGS. 2A to 4U are each a wave form chart for the explanation of the invention.

DESCRIPTION OF THE PREFERRED EMBODIMENT

Figure 1:
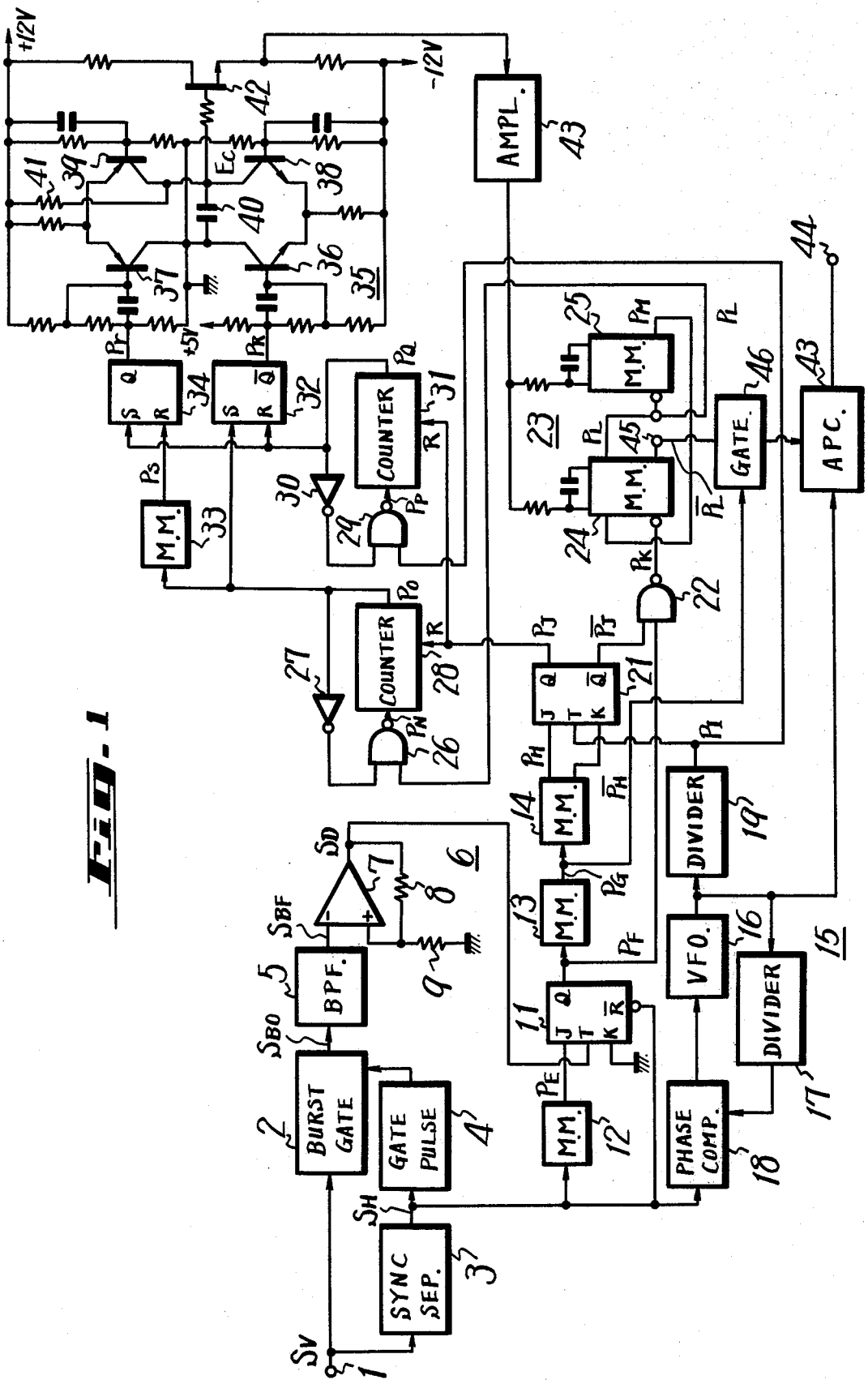
FIG. 1 is a systematic block diagram showing one embodiment of the reference signal generator according to the invention.

An example of the invention will be hereinafter described with reference to FIG. 1 which is a systematic block diagram thereof. In FIG. 1 reference numeral 1 designates an input terminal to which a reproduced color video signal $S_V$ is applied (as in FIG. 2A, the reproduced color video signal $S_V$ includes a horizontal synchronizing signal $S_H$ and a burst signal $S_{BO}$). The reproduced color video signal $S_V$ applied to the input terminal 1 is fed to a burst gate circuit 2 and simultaneously to a horizontal synchronizing signal separator circuit 3 from which the horizontal synchronizing signal $S_H$ (as shown by FIG. 2B) is derived. This signal $S_H$ is applied to a gate pulse forming circuit 4 including a delay circuit for delaying a pulse by a predetermined amount. The gate pulse produced at the output side of the gate pulse forming circuit 4 is applied to the burst gate circuit 2 to produce therefrom the burst signal $S_{BO}$, which is applied to a band-pass filter 5. The band-pass filter 5 thus produces a burst signal $S_{BF}$ (as shown by FIG. 2C) which is fed to a level detecting circuit 6.

The level detecting circuit 6 is composed of mainly of a differential amplifier 7 having its output end grounded through resistors 8 and 9, its (+) side input terminal connected to the junction between the resistors 8 and 9, and its (−) input end supplied with burst signal $S_{BF}$. The ratio of the resistance values of resistors 8 and 9 is selected to be, for example, 9 to 1 and hence the voltage at (+) side input terminal of differential amplifier 7 is one-tenth of the output voltage therefrom. While the burst signal $S_{BF}$ initially retains its amplitude at a small value less than 0.5 V, the level detecting circuit 6 generates an output voltage $S_D$ of 5 V and hence the voltage at (+) side input terminal of differential amplifier 7 is 0.5 V. When the burst signal $S_{BF}$ increases over 0.5 V, the output voltage $S_D$ becomes 0 V at the crossing point of 0.5 V, and thus the voltage at (+) side input terminal of differential amplifier 7 is also 0 V. Further, when the burst signal $S_{BF}$ goes to a negative voltage passed through zero volt after the increase from 0.5 V, the output voltage $S_D$ of differential amplifier 7 becomes 5 V at the crossing point of zero volt, and hence the voltage at (+) side input terminal thereof becomes 0.5 V.

The output voltage $S_D$ (shown in FIG. 2D) of the level detecting circuit 6 therefore falls or goes down from "1" to "0" when the burst signal $S_{BF}$ tends to increase over 0.5 V, and thereafter rises or goes up from "0" to "1" when the burst signal $S_{BF}$ comes to decrease below 0 V.

The output voltage $S_D$ is applied to a T-input terminal of a JK flip-flop circuit 11. While, the horizontal synchronizing signal $S_H$ (shown by FIG. 2B) derived from the synchronizing separator circuit 3 is applied to a monostable multivibrator 12 to produce therefrom a pulse $P_E$ (shown by FIG. 2E) that is maintained at "0" for a constant time period from the trailing edge of horizontal synchronizing signal $S_H$ to the mid point of burst signal $S_{BF}$. This pulse $P_E$ is applied to a J-input terminal of JK flip-flop circuit 11, while a reset terminal $\overline{R}$ thereof is supplied with the horizontal synchronizing signal $S_H$ in reversed state.

As a result, the JK flip-flop circuit 11 produces at its Q-terminal a pulse $P_F$ (shown by FIG. 2F) that falls or goes down at the leading edge of horizontal synchronizing signal $S_H$ and rises or goes up at a time point $t_1$ when the output voltage $S_D$ of level detecting circuit 6 is risen up immediately after the output pulse $P_E$ from monostable multivibrator 12 is risen up.

Although the burst signal $S_{BO}$ and hence burst signal $S_{BF}$ have the correct-phase at its mid portion of only one or two cycles and the incorrect phase at the front and back cycles, as described above, if the time interval during which the monostable multivibrator 12 keeps its quasi-stable state, i.e., the pulse width of pulse $P_E$ is suitably selected, the time point $t_1$ when the output pulse $P_F$ of JK flip-flop circuit 11 rises up is set at the point where the burst signal $S_{BF}$ is going to decrease over zero volt in its correct phase cycle.

The output pulse $P_F$ of the JK flip-flop circuit 11 is applied to a monostable multivibrator 13, which produces a pulse $P_G$ (shown by FIG. 2G) of a constant pulse width initiated at time $t_1$. This pulse $P_G$ is further applied to a monostable multivibrator 14 to produce therefrom a pulse $P_H$ (shown by FIG. 2H) having a constant pulse width initiated at the trailing edge of pulse $P_G$ and an inverted pulse $\overline{P}_H$ thereof. In this case, the pulse width of pulse $P_G$ is selected to be the time interval corresponding to a required number of a train of pulses which are finally produced from an output terminal 45% an oscillator 23 as described later, and the pulse width of pulse $P_H$ may be selected smaller than the above pulse.

On the other hand, a phase synchronizing circuit, or so-called PLL 15 of automatic frequency control circuit (AFC) arrangement generates a continuous wave signal of the frequency coincident with that of burst signal $S_{BO}$. That is, there is provided a variable frequency oscillator 16, which delivers an oscillation signal to a frequency divider 17 by which the frequency thereof is divided into 1/455. A phase comparator circuit 18 acts to compare the horizontal synchronizing signal $S_H$ from the synchronizing signal separator circuit 3 with the divided signal from the frequency divider 17 to produce a compared output, by which the variable frequency oscillator 16 is controlled in its oscillation frequency. The controlled oscillation signal from variable frequency oscillator 16 is fed to a frequency divider 19, which produces a pulse $P_I$ by dividing the frequency of the signal applied thereto into ½. Since there is always established the following relation between the horizontal signal frequency $f_H$ and the burst signal frequency, or subcarrier frequency $f_{SC}$ in the NTSC video signal:

$$f_{SC} = (455/2) f_H \quad (1)$$

the repetition frequency of pulse $P_I$ is kept in accordance with the frequency of reproduced horizontal synchronizing signal $P_H$, or, coincident with the frequency of reproduced burst signal $S_{BO}$.

The output pulse $P_H$ and the inverted pulse $\overline{P}_H$ thereof from the above mentioned monostable multivibrator 14 are applied to J- and K-input terminals of JK flip-flop circuit 21, respectively, and the output pulse $P_I$ (shown by FIG. 2I) from PLL 15, or frequency divider 19 is applied to a T-input terminal of JK flip-flop circuit 21. As a consequence, the JK flip-flop circuit 21 produces a pulse $P_J$ (shown by FIG. 2J) that rises up at the leading edge of pulse $P_I$ immediately after the rising edge of pulse $P_H$ and falls down at the leading edge of pulse $P_I$ immediately after the trailing edge of pulse $P_H$, and the inverted pulse $\overline{P}_J$ thereof.

The pulse $\overline{P}_J$ and the output pulse $P_F$ (shown by FIG. 2F) of JK flip-flop circuit 11 are fed to a NAND circuit 22 to form a pulse $P_K$ (shown by FIG. 2K) that becomes "1" during the pulse-width intervals of pulses $P_F$ and $P_J$.

This pulse $P_K$ is applied to an oscillator 23 which, in this illustrated embodiment, is composed of two monostable multivibrators 24 and 25. That is, the pulse $P_K$ is fed to one trigger terminal of the monostable multivibrator 24 after being inverted, and the output of the monostable multivibrator 24 is applied to the trigger terminal of the other monostable multivibrator 25 after being inverted. In addition, the output of the other monostable multivibrator 25 is fed to the other trigger terminal of the monostable multivibrator 24. In this case, the time intervals $\tau$ during which monostable multivibrators 24 and 25 keep their quasi-stable state are controlled by the voltage obtained from an error detector or comparator as described later and are made equal to each other.

Therefore, when the burst signal $S_{BF}$ changes over the zero-volt level at time $t_1$, the pulse $P_K$ falls down, causing the output $P_L$ (shown by FIG. 2L) of monostable multivibrator 24 to be risen up, and after the lapse of time interval $\tau$ the output $P_L$ falls down. The falling-down of output $P_L$ makes the output $P_M$ (shown by FIG. 2M) of monostable multivibrator 25 fallen down and after the lapse of time interval $\tau$ the output $P_M$ rises up. The rising-up of output $P_M$ causes output $P_L$ to be risen up and after the lapse of time interval $\tau$ the output $P_L$ falls down. Thereafter, the above operation will be repeated.

The outputs $P_L$ and $P_M$ of monostable multivibrators 24 and 25 are therefore each a train of pulses with the duty ratio of ½ in the interval during which pulse $P_K$ falls down.

When the pulse $P_K$ again falls down at time $t_2$, each of the outputs $P_L$ and $P_M$ similarly takes the form of a train of pulses with the duty ratio of ½.

The output pulse $P_L$ of the oscillator 23 is fed to a NAND circuit 26. The output of an inverter 27 becomes "1" after the output pulse $P_J$ of the above-mentioned JK flip-flop circuit 21 rises up as described later, so that the NAND circuit 26 produces an output $P_N$ (shown by FIG. 2N) corresponding to the inverted pulse of pulse $P_L$ after the rising-up of pulse $P_J$. This pulse $P_N$ is applied to a counter 28, which is also supplied at its reset terminal $\overline{R}$ with the pulse $P_J$. Thus, the counter 28 is reset by the rising edge of pulse $P_J$ to make its output $P_O$ (shown by FIG. 2O) "0" and released from its reset condition by the falling edge of pulse $P_J$. Therefore, after the pulse $P_J$ falls down at time $t_2$, the pulse $P_N$ is counted at its falling edge by the counter 28, and when its count reaches, for example, $2^7 = 128$, the output $P_O$ of counter 28 becomes "1". Then, the inverter 27 supplied with the output $P_O$ of "1" produces "0" output and hence the output $P_N$ of NAND circuit 26 is kept "1" with the result that no pulse is applied to counter 28.

On the other hand, the output pulse $P_I$ of the above-mentioned PLL 15, or frequency divider 19 is fed to a NAND circuit 29. Since the output of an inverter 30 becomes "1" after the pulse $P_J$ rises up as described later, the output $P_P$ (shown by FIG. 2P) of NAND circuit 29 becomes the inverted pulse of pulse $P_I$ after the rising up of the pulse $P_J$, and this pulse $P_P$ is fed to a counter 31. The pulse $P_J$ is also fed to the reset terminal $\underline{R}$ of the counter 31, which is reset by the rising edge of pulse $P_J$ to make its output $P_Q$ (shown by FIG. 2Q) "0" and released from its reset condition by the falling edge of pulse $P_J$. Thus, after the pulse $P_J$ falls down at time $t_2$, the pulse $P_P$ is counted at its falling edge by counter 31. When the count of counter 31 reaches $2^7 = 128$ as described above, the output $P_Q$ of counter 31 goes up to "1". The rising-up of output $P_Q$ results in "0" output of inverter 30 and hence the output $P_P$ of NAND circuit 29 is kept at "1" with the result that no pulse is applied to counter 31.

In this case, when the output pulse $P_I$ of PLL 15 rises up, the output pulse $P_J$ from JK flip-flop circuit 21 falls down at time $t_2$, thereby causing the output pulse $P_L$ of oscillator 23 to rise up. Therefore, the falling down of pulse $P_P$ at the rising edge of pulse $P_I$ is found to occur with a very small time difference from that of pulse $P_N$ at the rising edge of pulse $P_L$ by considering the time lag in the process of forming each pulse. That is, considering at time $t_2$ when pulse $P_J$ falls down, the falling-down of pulse $P_P$ occurs a moment before the time point $t_2$, whereas the pulse $P_N$ falls down a moment after the time point $t_2$ (though this time difference error is not shown in FIG. 2). As a result, even if the counter 28 progresses to "1" by counting pulse $P_N$, the counter 31 does not count pulse $P_P$ yet and thus shows "0". In other words, the counter 31 starts to count one period of time (the interval of $p$) of pulse $P_P$ later than does counter 28.

Therefore, if the frequency of pulse $P_L$ obtained from oscillator 23 and hence the pulse $P_N$ counted by counter 28 coincides with that of pulse $P_I$ obtained from PLL 15 and hence the pulse $P_P$ counted by counter 31, and thus one period of pulse $P_L$ (or $P_N$) equals that of pulse $P_I$ (or $P_P$), then as shown in FIG. 2, the time point when counter 28 counts to "128" to produce output $P_O$ of "1" is faster by one period of pulse $P_L$ and hence $P_I$ than the time point when counter 31 counts to "128" to produce output $P_Q$ of "1".

The output $P_O$ of counter 28 is applied to a set terminal S of a flip-flop circuit 32 and the output $P_Q$ of counter 31 is fed to a reset terminal R of flip-flop circuit 32. As a consequence, an output $P_R$ (shown by FIG. 2R) of flip-flop circuit 32 remains "0" in an interval $q$ from the rising edge of output $P_O$ to the rising edge of output $P_Q$. Thus, if the intervals of $p$ and $q$ as mentioned previously are made equal to each other, the frequency of pulse $P_N$ comes to coincide with that of pulse $P_P$ (i.e., the frequency of pulse $P_L$ comes to coincide with that of pulse $P_I$). The arrangement for the coincidence of the frequencies will now be described. The output $P_O$ of counter 28 is applied to a monostable multivibrator 33 to produce therefrom a pulse $P_S$ (shown by FIG. 2S) that remains "0" for a constant time from the rising edge of output $P_O$. The output $P_Q$ of counter 31 is fed to a set terminal $\underline{S}$ of another flip-flop circuit 34 which is supplied at its reset terminal R with the output $P_S$ of monostable multivibrator 33 with the result that an output $R_T$ (shown by FIG. 2T) of flip-flop circuit 34 remains "1" in the interval from the rising edge of output $P_Q$ to that of output $P_S$.

In this case, the interval of time during which the monostable multivibrator 33 keeps the quasi-stable state, i.e., the time interval within which the output $P_S$ is "0", is selected twice the reciprocal of the normal subcarrier frequency, namely, $2/3.58$ $\mu$ sec.

Therefore, if the frequency of pulse $P_I$ obtained from PLL 15 is 3.58 MH$_z$ of the normal subcarrier frequency and the frequency of pulse $P_L$ from oscillator 23 equals to the above frequency, the time difference between the rising edges of outputs $P_O$ and $P_Q$ is $1/3.58$ $\mu$ sec by ignoring the very small time difference between the rising edges of the pulses $P_I$ and $P_L$. Thus, the time interval during which an output $P_R$ of flip-flop circuit 32 is "0" equals that during which an output $P_T$ of flip-flop circuit 34 is "1". Further, even though the frequency of the reproduced horizontal synchronizing signal $P_H$ is not the normal value of 15.734 kH$_z$ and hence the frequency of pulse $P_I$ obtained from PLL 15 along therewith is deviated from the normal subcarrier frequency of 3.58 MH$_z$, the time difference therebetween is comparatively small. Thus, if the frequency of pulse $P_L$ obtained from oscillator 23 equals that of the pulse $P_I$, the time interval during which output $P_R$ is "0" almost equals that during which output $P_T$ is "1".

Shown at 35 is an error detector or comparator, in which NPN and PNP transistors 36 and 37 are connected in a differential form to NPN and PNP transistors 38 and 39. The collectors of transistors 36 and 37 are connected in common, and those of transistors 38 and 39 are similarly connected in common with a capacitor 40 coupled between those common connection points. The capacitor 40 is charged through a resistor 41 from a voltage source of +12 V and a voltage $E_C$ thereacross is applied through a field effect transistor 42 of source follower configuration and through a DC amplifier 43 to the two monostable multivibrators 24 and 25 that constitute the above mentioned oscillator 23.

In the interval during which counters 28 and 31 do not progress together to "128", the output $P_R$ of flip-flop circuit 32 is "1" and the output $P_T$ of flip-flop circuit 34 is "0", transistors 36 and 37 whose bases are supplied with outputs $P_R$ and $P_T$ are both conductive and hence transistors 38 and 39 are nonconductive together with the result that the voltage $E_C$ across capacitor 40 is not changed.

When the count of counter 28 reaches "128" and then flip-flop circuit 32 produces output $P_R$ of "0", transistor 36 is turned off during the interval of output $P_R$ being "0" and hence transistor 38 is turned on with the result that the charge stored in capacitor 40 discharges through this transistor 38. Then, when the counter 31 progresses to "128" to make the flip-flop circuit 34 produce output $P_T$ of "1", the transistor 37 is turned off during the interval of output $P_T$ being "1" and hence transistor 39 is turned on with the capacitor 40 being charged through this transistor 39. In this case, a current is made constant that flows through transistors 38 and 39 when they are turned on.

Therefore, when the frequency of pulse $P_L$ obtained from oscillator 23 coincides with that of pulse $P_I$ delivered from PLL 15 as described above and hence the time interval during which output $P_R$ is "0" equals that during which output $P_T$ is "1", the voltage $E_C$ across capacitor 40 first drops by a constant value only and then increases by the same amount, thus remaining unchanged as shown by FIG. 2U. At this time there is no variation in the time interval $\tau$ during which monostable multivibrators 24 and 25 constituting oscillator 23 keep the quasi-stable state, and accordingly the oscillation frequency of oscillator 23 and hence the frequency of pulse $P_L$ is maintained coincident with that of pulse $P_I$ obtained from PLL 15.

Further, when the frequency of pulse $P_L$ obtained from oscillator 23 and hence that of pulse $P_N$ becomes lower than that of pulse $P_I$ obtained from PLL 15 and hence lower than that of pulse $P_P$, the time point when the counter 28 counts to "128" and its output $P_O$ (shown by FIG. 3O) rises up approaches the time point when counter 31 counts to "128" and its output $P_Q$ (shown by FIG. 3Q) rises up. Thus, from the fact that the output $P_S$ (shown by FIG. 3S) of monostable multivibrator 33 has a constant "0"-level duration, the "0"-level duration of output $P_R$ (shown by FIG. 3R) of flip-flop circuit 32, i.e., the time interval during which capacitor 40 is discharged, becomes less than the "1"-level duration of output $P_T$ (shown by FIG. 3T) of flip-flop circuit 34, i.e., the time interval during which capacitor 40 is charged, and hence the voltage $E_C$ across capacitor 40 becomes larger than the previous value as shown by FIG. 3U. At this time, the time interval $\tau$ during which the monostable multivibrators 24 and 25 of oscillator 23 keep the quasi-stable state is reduced, that is, the frequency of pulse $P_L$ is increased to coincide with that of pulse $P_I$ obtained from PLL 15.

On the contrary, when the frequency of pulse $P_L$ obtained from oscillator 23 and hence that of pulse $P_N$ becomes higher than that of pulse $P_I$ produced from PLL 15 and hence that of pulse $P_P$, the time point when counter 28 counts to "128" and its output $P_O$ (shown by FIG. 4O) rises up goes far from the time point when counter 31 counts to "128" and its output $P_Q$ (shown by FIG. 4Q) rises up. As a result, the voltage $E_C$ across capacitor 40 becomes smaller than the previous value as shown by FIGS. 4R to 4U in association with FIGS. 3R to 3U. At this time, the time interval $\tau$ during which the monostable multivibrators 24 and 25 of oscillator 23 keep the quasi-stable state is therefore increased, that is, the frequency of pulse $P_L$ is decreased to coincide with that of the pulse $P_I$ derived from PLL 15.

In this way, the frequency of pulse $P_L$ produced from oscillator 23 is made equal to that of pulse $P_I$ derived from PLL 15 which has always a fixed relation with the frequency of reproduced horizontal synchronizing signal $S_H$ as expressed by Eq.(1). The rising-up of pulse $P_L$ at time $t_1$ occurs at a constant position on one cycle of correct phase in the burst signal $S_{BF}$, so that the phase of this pulse $P_L$ has a fixed relation with the correct phase of the burst signal $S_{BO}$.

Therefore, at least 1H after the operation for the coincidence of the phase and frequency with those of the input burst signal as described above, the output pulse of oscillator 23, for example, the inverted pulse $\bar{P}_L$ of pulse $P_L$ is derived by a necessary number of pulses from output terminal 45 of oscillator 23 through a gate circuit 46 which is gated with pulse $P_G$ from monostable multivibrator 13 during an interval $T_O$ corresponding to the pulse width of pulse $P_G$, and hence it is possible to obtain a reference signal for a clock pulse that should be applied to a write memory (not shown) in the above-mentioned TBC (time base error corrector). The reference signal of a few cycles from output end 45, the phase of which is coincident with that of the color burst signal of an input video signal, is applied to a linking oscillator or automatic phase control (APC) circuit 43 to produce therefrom a continuous pulse, which may be used through an output terminal 44 thereof to serve as a switching signal for the write memory. The APC circuit is adapted to produce a continuous pulse by being supplied with the above-mentioned few cycles of the output of oscillator 23 and the output of an AFC or PLL 15.

As described above, according to the invention, even though the horizontal synchronizing signal frequency is varied upon slow or still reproduction, it is possible to obtain a switching pulse the frequency of which is coincident with the changed frequency and the phase of which is synchronized with the best correct phase of the color burst signal.

The reference signal generator according to the invention can be applied not only to the case where a reference signal is obtained that should be supplied to the APC for producing a clock pulse in the case of correcting the time difference error, but also to the case where a comparing signal is obtained that should be supplied to the so-called APC circuit for changing the band of the chrominance signal of a composite color video signal in a video tape recorder, for example.

Further, the reference signal generator according to the invention can be generally used to generate a chain of pulses from an oscillator the oscillation phase of which is synchronized with an input pulse and the frequency of which is coincident with that of a continuous wave signal which is much higher than that of the input pulse.

The above description is given on a single preferred embodiment of the invention, but it will be apparent that many modifications and variations could be effected by one skilled in the art without departing from the spirits or scope of the novel concepts of the invention, so that the scope of the invention should be determined by the appended claims only.

We claim as our invention:

1. A reference signal generator for generating a number of pulses having a predetermined phase and frequency, comprising:
   a. an input terminal to which a phase reference signal is supplied;
   b. an output terminal from which a number of phases and frequency controlled pulses are obtained;
   c. a first oscillator for oscillating a number of pulses phase-locked with said phase reference input signal, said first oscillator being connected to said output terminal;
   d. a second oscillator for feeding a number of pulses having a predetermined frequency to said first oscillator;
   e. a first and a second counting means for counting said number of pulses fed from said first oscillator and said second oscillator, respectively; and
   f. an error detector for detecting a time difference error between two time points at which the count of each of said counting means reaches the predetermined number, and for controlling the oscillating frequency of said first oscillator due to the error signal thereof by which said output pulses of said output terminal are phase-locked with said reference input signal and are coincident in frequency with said number of pulses fed from said second oscillator.

2. A reference signal generator according to claim 1, wherein an initial oscillation phase of said oscillated pulses is phase-locked with one selected pulse of said reference input signal.

3. A reference signal generator according to claim 1, wherein said number of pulses fed from said second oscillator are frequency-controlled based on a frequency of said reference input signal.

4. A reference signal generator according to claim 3, wherein said second oscillator has an automatic frequency control circuit controlled by said frequency of said reference input signal.

5. A reference signal generator for use with a color video signal processing circuit, said pulse generator generating a number of reference output pulses, a phase of which is phase-locked with an input color burst signal of a composite color video signal and a frequency of which is related with a burst frequency of said color burst signal, comprising:
   a. an input terminal to which a composite color video signal having a color burst signal and horizontal and vertical synchronizing signals is supplied;
   b. an output terminal;
   c. a first oscillator for oscillating a number of pulses phase-locked with said color burst signal;
   d. a second oscillator for feeding a number of pulses frequency-controlled by said horizontal synchronizing signals;
   e. a first and a second counting means for counting said number of pulses fed from said first and second oscillators, respectively; and
   f. an error detector for detecting a time difference error between two time points which the count of said each counting means reaches the predetermined number respectively, and for controlling the oscillating frequency of said first oscillator due to the error signal thereof by which said output pulses at said output terminal are phase locked with said color burst signal and are coincident in frequency with said number of pulses fed from said second oscillator.

6. A reference signal generator according to claim 5, wherein said a number of pulses oscillated by said first oscillator are phase-locked with a selected pulse cycle of said color burst signal.

7. A reference signal generator according to claim 6, wherein said second oscillator has an automatic frequency control circuit controlled by said horizontal synchronizing signals.

8. A reference signal generator according to claim 6, wherein said second oscillator oscillates the same frequency basically as said color burst signal.

9. A reference signal generator according to claim 8, wherein a number of phases and frequency controlled reference output pulses are obtained for a selected period within one horizontal signal interval of said composite color video signal.

* * * * *